(12) United States Patent
Hwang et al.

(10) Patent No.: US 6,901,656 B2
(45) Date of Patent: Jun. 7, 2005

(54) POSITION CONTROL APPARATUS OF FEEDER STAGE IN SURFACE MOUNT DEVICE

(75) Inventors: Ji Hyun Hwang, Kyungki-do (KR); Do Hyun Kim, Kyoungki-do (KR)

(73) Assignee: Mirae Corporation, Chunan-Si (KR)

( * ) Notice: Subject to any disclaimer, the term of this patent is extended or adjusted under 35 U.S.C. 154(b) by 87 days.

(21) Appl. No.: 09/983,377

(22) Filed: Oct. 24, 2001

(65) Prior Publication Data

US 2002/0051705 A1 May 2, 2002

(30) Foreign Application Priority Data

Oct. 27, 2000 (KR) ......................................... 2000-63585

(51) Int. Cl.$^7$ .............................................. B23B 19/00
(52) U.S. Cl. .............................. 29/739; 29/740; 29/744; 414/749.1
(58) Field of Search .......................... 29/744, 712, 739, 29/740, 743, 759, 832–836; 414/752.1, 749.1; 198/861.4, 589

(56) References Cited

U.S. PATENT DOCUMENTS

| | | | | |
|---|---|---|---|---|
| 4,575,942 A | * | 3/1986 | Moriyama | 33/1 |
| 4,817,266 A | | 4/1989 | Holcomb | 29/566.3 |
| 4,925,139 A | * | 5/1990 | McCord | 248/179 |
| 5,495,661 A | * | 3/1996 | Cromer et al. | 29/740 |
| 5,979,045 A | * | 11/1999 | Nishimori et al. | 29/832 |
| 5,991,005 A | * | 11/1999 | Horikawa et al. | 355/53 |
| 6,032,845 A | | 3/2000 | Piccone et al. | 226/139 |
| 6,347,442 B1 | * | 2/2002 | Hwang | 29/281.4 |
| 6,427,313 B2 | * | 8/2002 | Ishitani et al. | 29/559 |
| 6,526,651 B1 | * | 3/2003 | Hwang | 29/740 |
| 2002/0051705 A1 | * | 5/2002 | Hwang et al. | 414/749.1 |

FOREIGN PATENT DOCUMENTS

JP  6-58969  *  3/1994 ................. 343/703

* cited by examiner

*Primary Examiner*—Minh Trinh
(74) *Attorney, Agent, or Firm*—Fleshner & Kim LLP

(57) ABSTRACT

A position control apparatus of a feeder stage is disclosed, at which a tape reel for feeding parts to be mounted on a PCB is mounted in a surface mount device (SMD). The position control apparatus includes a feeder stage disposed inside a base frame of a SMD, a height/rotation power transmission device for controlling a height (Z) and a rotation angle (θ) of the feeder stage, a first power transmission device for controlling the X-axis position of the feeder stage, and a second power transmission device for controlling the Y-axis position of the feeder stage. Therefore, the apparatus can be easily controlled the mounting position of the tape reel by controlling the position of the feeder stage at which the tape reel is mounted in the SMD.

8 Claims, 4 Drawing Sheets

POSITION CONTROL APPARATUS OF FEEDER STAGE IN SURFACE MOUNT DEVICE

BACKGROUND OF THE INVENTION

1. Field of the Invention

The present invention relates to a position control apparatus of a feeder stage in a surface mount device, and more particularly, to a position control apparatus of a feeder stage at which a tape reel for feeding parts to be mounted on a printed circuit board is mounted in a surface mount device.

2. Description of the Related Art

A surface mount device includes a base frame, a X-Y gantry, a module head, a PCB carrier and a feeder stage. The X-Y gantry is installed on the base frame, and the module head installed at a predetermined portion of the X-Y gantry is movable in the X-Y gantry in a predetermined direction. The module head moves in the predetermined direction and mounts parts fed through the feeder stage on a printed circuit board (hereinafter, "PCB"). The PCB (not shown) on which parts are mounted is carried to a part mounting work position by the PCB carrier.

The construction of the surface mount device for mounting parts on the PCB carried to the part mounting work position will now be described in more detail with reference to the accompanying drawings. As illustrated in FIG. 1, the surface mount device 10 includes a base frame 11, a X-Y gantry 12, a plurality of module heads 13 and 14, a PCB carrier 17 and a feeder stage 16. The base frame 11 is used for supporting the overall load of the surface mount device 10. On the plane of the base frame 11, the X-Y gantry is installed.

The X-Y gantry includes a Y-axis stator frame 12a, a plurality of Y-axis permanent magnets 12b, a Y-axis mover 12c, a X-axis stator frame 12d, a plurality of X-axis permanent magnets 12e and a X-axis mover 12f. On an inner wall of the Y-axis stator frame 12a, the plurality of Y-axis permanent magnets 12b each having N and S poles are installed at a predetermined interval, and on an inner wall of the X-axis stator frame 12d, the plurality of X-axis permanent magnets 12e each having N and S poles are installed at a predetermined interval. Inside the Y-axis stator frame 12a having the plurality of Y-axis permanent magnets 12b, the Y-axis mover 12c is installed, and inside the X-axis stator frame 12d, the X-axis mover 12f is installed.

On the plane of the X-axis mover 12f, a first module head 13 of the plurality of module heads 13 and 14 is installed. When an electric signal is fed to a plurality of armature coils (not shown) installed at the X-axis mover 12f at a predetermined interval, the first module head 13 installed on the plane of the X-axis mover 12f moves in the X-axis direction by thrust force generated between the armature coils and the X-axis permanent magnets 12e. To move the first module head 13 in the Y-axis direction, the X-axis stator frame 12d is moved in the Y-axis direction.

Since the X-axis stator frame 12d is formed integrally with the Y-axis mover 12c, it can be moved in the Y-axis direction. The Y-axis mover 12c formed integrally with the X-axis mover 12c is installed inside the Y-axis stator frame 12a. When an electric signal is fed to a plurality of armature coils (not shown) installed at the Y-axis mover 12c at a predetermined interval, thrust force is generated between the armature coils and the Y-axis permanent magnets 12b and the Y-axis mover 12c is moved in the Y-direction by this thrust force.

As the Y-axis mover 12c moves, the X-axis stator frame 12d formed integrally with the Y-axis mover 12c is moved in the Y-axis direction and thusly the first module head 13 is moved in the Y-axis direction. Like the first module head 13 moving in the X-Y axis direction, the second module head 14 is also moved in the X-Y axis direction in the same way with the first module head 13. The first module head 13 and the second module head 14 moving in the X-Y axis direction sucks and holds parts, and then mounts them on the PCB carried by the PCB carrier 17.

Parts are mounted at the feeder stage 16 in a state of a tape reel (not shown). The feeder stage 16 at which the tape reel is mounted includes, as illustrated in FIG. 2, a connection member 16a, a positioning pin 16b, a clamp 16c, a guide panel 16e and a handle 16d.

The connection member 16a fixes the feeder stage 16 on the base frame 11, and the position setting pin 16b and the guide panel 16e are used for guiding or setting a position when mounting the tape reel. The handle 16d is used such that an operator can install and remove the feeder stage 16 easily.

As described above, the feeder stage in the surface mount device according to the conventional art is fixed and installed at the base frame. Since the feeder stage is fixed and installed at the base frame, it is impossible to control the position of the feeder stage in the event that the carrying position of a part and the position of the taper reel are aligned wrongly when mounting the tape reel on the feeder stage.

SUMMARY OF THE INVENTION

It is, therefore, an object of the present invention to provide a position control apparatus which can control the position of the feeder stage at which the tape reel is mounted in the surface mount device for mounting printed circuit board parts.

It is another object of the present invention to provide a position control apparatus which can control easily the mounting position of the tape reel by freely controlling the position of the feeder stage at which the tape reel is mounted in the surface mount device.

To achieve the above object, there is provided a position control apparatus of a feeder stage in a surface mount device comprising: a feeder stage disposed inside a base frame of the surface mount device; a height/rotation power transmission device installed at the center of the bottom of the feeder stage for controlling a height and a rotation angle of the feeder stage; a first power transmission device installed at the bottom of the height/rotation power transmission device for controlling the X-axis position of the feeder stage; and a second power transmission device installed at the bottom of the first power transmission device for controlling the Y-axis position of the feeder stage.

Preferably, the height/rotation power transmission device comprises a linear gear in which its one end is installed at the center of the bottom of the feeder stage, and a cylindrical stator, in which the other end of the linear gear is installed to its inside, for controlling a height and a rotation angle of the feeder stage installed at one end of the linear gear.

In addition, the first power transmission device comprises a first mover installed at the bottom of the cylindrical stator of the height/rotation power transmission device, and having a first armature coil unit installed at the center of its bottom; and a first stator in which the first armature coil unit is installed at its inside and a plurality of first permanent magnets are installed on an inner wall of the first stator at predetermine intervals.

Also, preferably, the second power transmission device comprises a second mover installed to the bottom of the first stator of the first power transmission device, and having a second armature coil installed at the center of its bottom; and a second stator in which a second armature coil unit is installed to its inside and a plurality of second permanent magnets are installed on an its inner wall at a predetermined interval.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will now be described with reference to the accompanying drawings.

Figure 1:
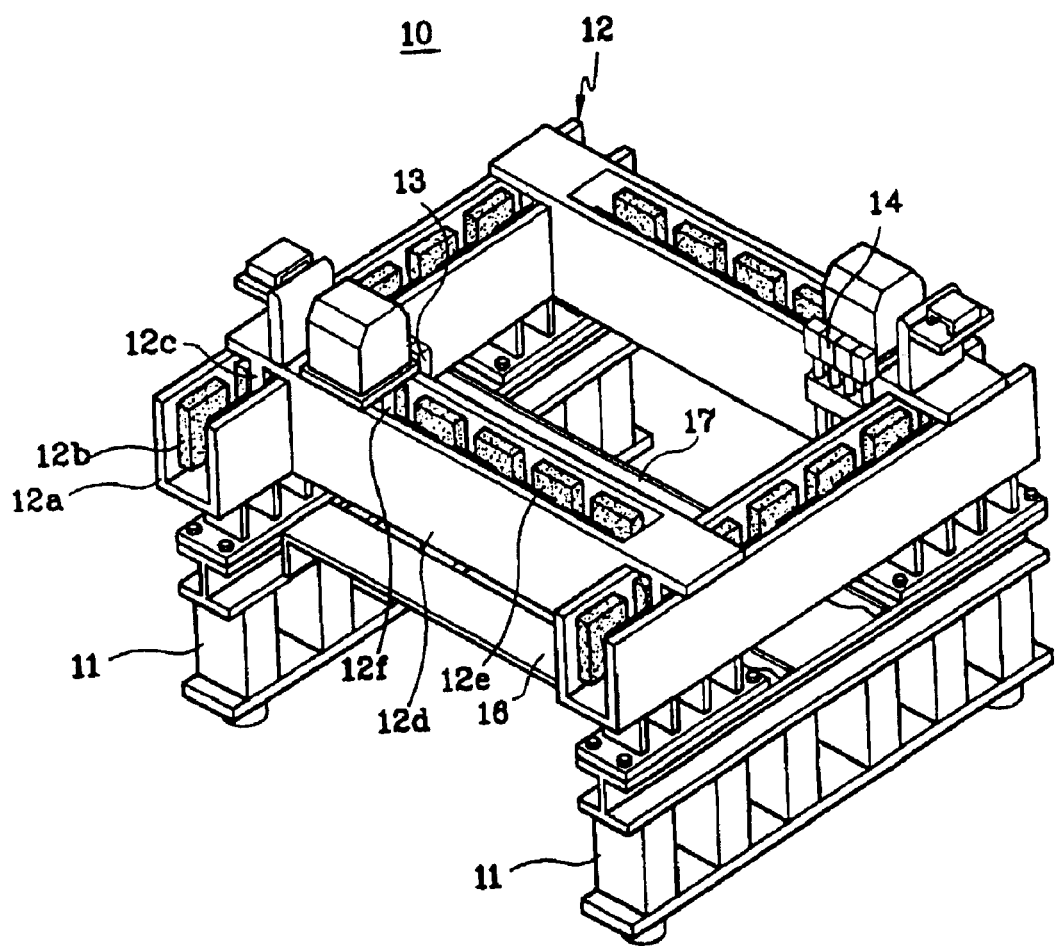
FIG. 1 is a perspective view of a conventional surface mount device.
Figure 2:
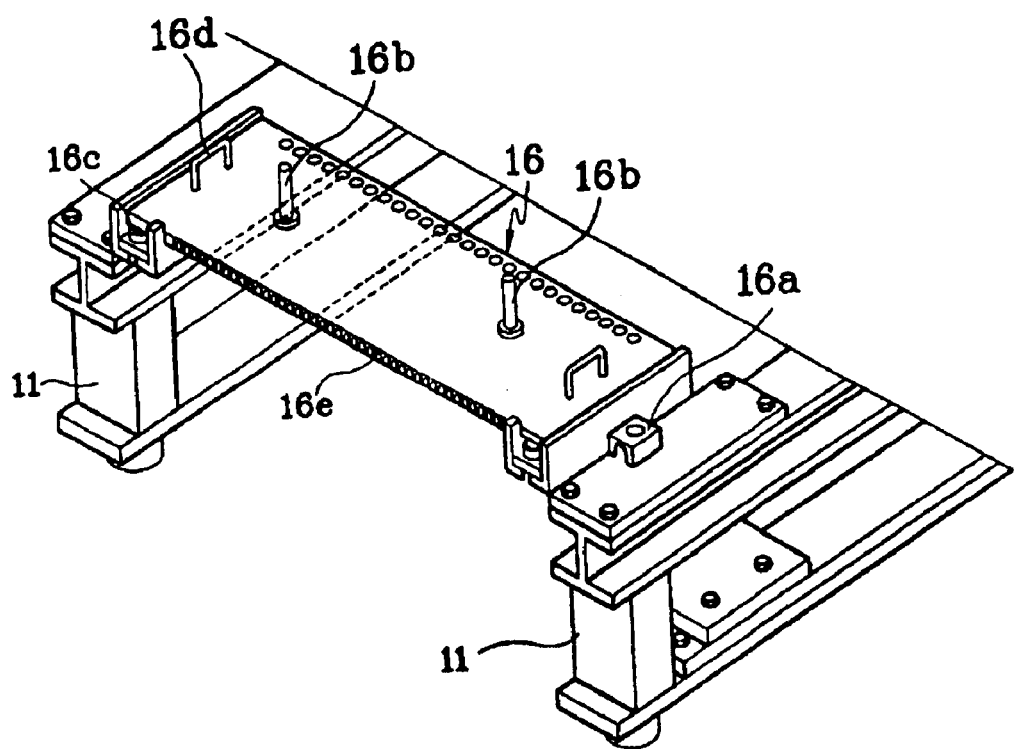
FIG. 2 is a perspective view of a feeder stage as shown in FIG. 1.
Figure 3:
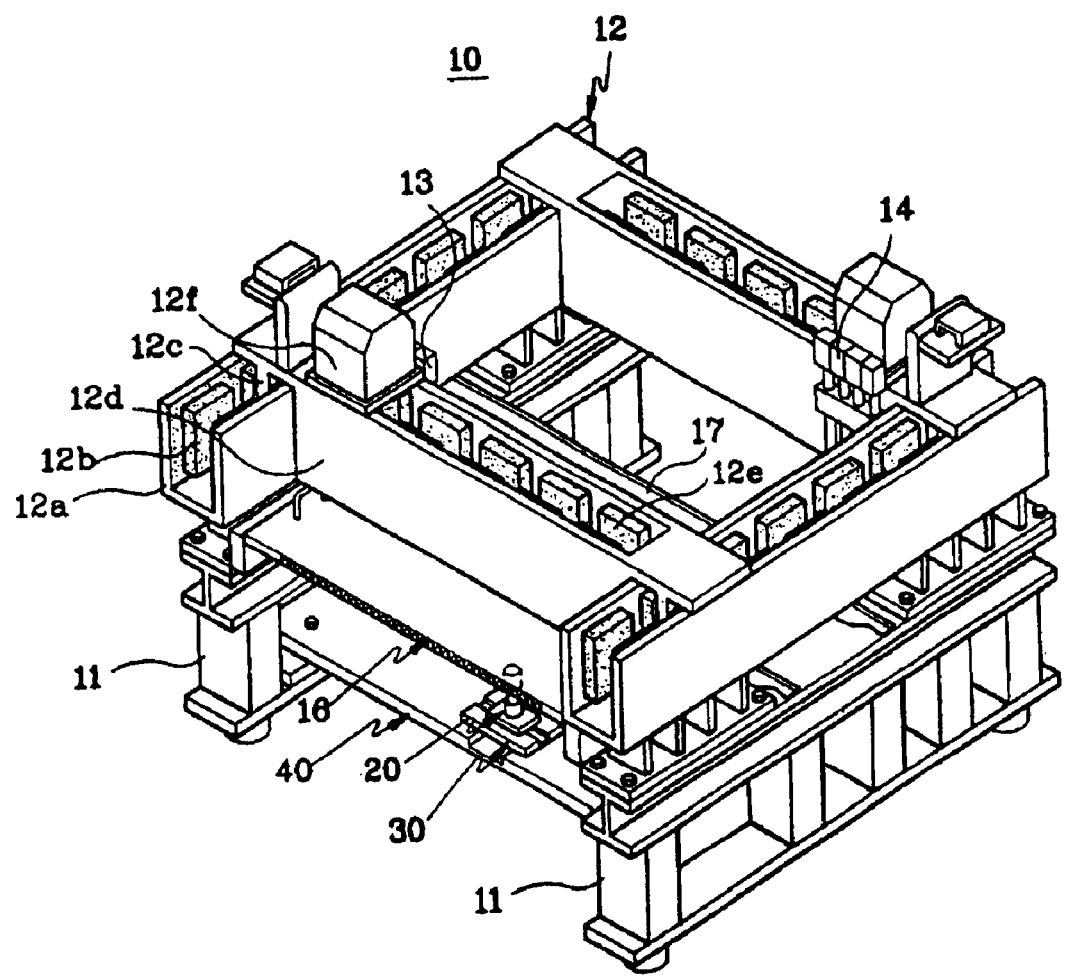
FIG. 3 is a perspective view of a surface mount device according to the present invention.
Figure 4:
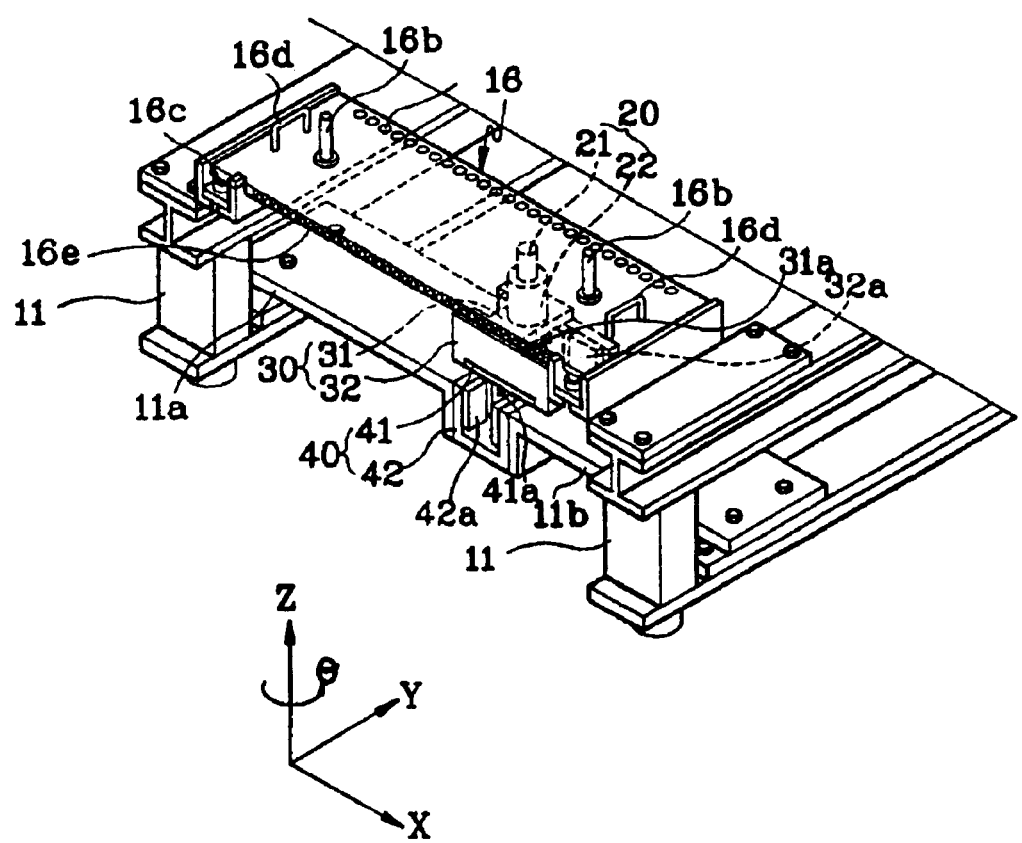
FIG. 4 is a perspective view of a position control apparatus of a feeder stage as shown in FIG. 3.

FIG. 3 is a perspective view of a surface mount device according to the present invention. FIG. 4 is a perspective view of a position control apparatus of a feeder stage as shown in FIG. 3.

A feeder stage 16 of the present invention is installed at one side of a base frame 11 of a surface mount device 10, and it is mounted such that the vertical, front/rear and lateral positions thereof are controlled by a height/rotation power transmission device 20 and first and second power transmission devices 30 and 40. As illustrated in FIG. 3, the surface mount device 10 adapted to the present invention includes a X-Y gantry 12, a plurality of module heads 13 and 14, a PCB carrier 17 and a feeder stage 16. The base frame 11 is used for supporting the overall load of the surface mount device 10, and the X-Y gantry 12 is installed on the plane of the base frame 11.

The X-Y gantry 12 includes a Y-axis stator frame 12a, a plurality of Y-axis permanent magnets 12b, a Y-axis mover 12c, a X-axis stator frame 12d, a plurality of X-axis permanent magnets 12e and a X-axis mover 12f. On an inner wall of the Y-axis stator frame 12a, the plurality of Y-axis permanent magnets 12b are installed at a predetermined interval, and, inside the Y-axis stator frame 12a, the Y-axis mover 12c is installed. The Y-axis mover 12c is formed integrally with the X-axis stator frame 12d. Inside the X-axis stator frame 12d formed integrally with the Y-axis mover 12c, the plurality of X-axis permanent magnets 12e are installed at a predetermined interval, and, between the X-axis permanent magnets 12e, the X-axis mover 12f is installed.

On the plane of the X-axis mover 12f, a first module head 13 of the plurality of module heads 13 and 14 is installed. Thus, the first module head 13 is moved in the X-axis direction by the movement of the X-axis mover 12f. To move the first module head 13 moved in the X-axis direction by the X-axis mover 12f, the X-axis stator frame 12d moves the Y-axis mover 12c formed integrally with the X-axis stator frame 12d in the Y-axis direction. Like the first module head 13 moving in the X-Y axis direction, the second module head 14 is also moved in the X-Y axis direction in the same way with the first module head 13.

The first module head 13 and the second module head 14 moving in the X-Y axis direction mounts parts on the PCB carried by the PCB carrier 17.

Parts are mounted at the feeder stage 16 in a state of a tape reel (not shown). The feeder stage 16 at which the tape reel is mounted includes, as illustrated in FIG. 4, a positioning pin 16b, a clamp 16c, a guide panel 16e and a handle 16d.

The feeder stage 16 is fixed on the base frame 11, and the position setting pin 16b and the guide panel 16e are used for guiding or setting a position when mounting the tape reel. The handle 16d is used such that an operator can install and remove the feeder stage 16 easily. The feeder stage 16 is installed so that it can be freely moved from the base frame 11.

At one side of the feeder stage 16, a height/rotation power transmission device 20 is installed for controlling a height (Z) and a rotation angle (θ). The height/rotation power transmission device 20 is installed at the feeder stage 16 to control the height (Z) and rotation angle (θ) of the feeder stage 16. The height/rotation power transmission device 20 includes a linear gear 21 and a cylindrical stator 22 or includes a rotary/linear motor (not shown) formed integrally, so that linear and rotary motions are enabled simultaneously. Here, a power conversion device includes a rack/pinion gear, a ball screw and a timing belt (not shown).

One end of the linear gear 21 of the height/rotation power transmission device 20 is installed at the center of the bottom of the feeder stage 16 and the other end thereof is insertingly installed inside the cylindrical stator 22. The cylindrical stator 22 controls a height (Z) by ascending or descending the linear gear 21 in the Z direction, or controls a rotation angle (θ) by rotating the linear gear 21. One end of the linear gear 21 is rotatably installed below the feeder stage 16.

At the bottom of the cylindrical stator 22, a first power transmission device 30 is installed. The first power transmission device 30 moves the height/rotation power transmission device 20 in the X-axis direction, resultantly controlling the position of the feeder stage 16. The first power transmission device 30 includes a first mover 31 and a first stator 32.

The first mover 31 of the first power transmission device 30 is installed at the bottom of the cylindrical stator 22. At the center of the bottom of the first mover 31, a first armature coil unit 31a is installed. The first armature coil unit 31a is installed inside the first stator 32. On an inner wall of the first stator 32, a plurality of first permanent magnets 32a having N and S poles are installed at predetermine intervals. At the first armature coil unit 31a, a plurality of armature coils (not shown) are installed.

When an electric signal is fed to the plurality of armature coils, thrust force is generated between the first armature coil unit 31a and the plurality of first permanent magnets 32a for thereby moving the first mover 31 in the X-axis direction and controlling the X-axis position of the feeder stage 16. To control the Y-axis position of the feeder stage 16, a second power transmission device 40 is installed at the bottom of the first power transmission device 30. The second power transmission device 40 includes a second mover 41 and a second stator 42.

The second mover 41 of the second power transmission device 40 is connected to the bottom of the first stator 32 of the first power transmission device 30. At the center of the bottom of the second mover 41, a second armature coil unit 41a is installed. The second armature coil unit 41a is installed inside the second stator 42. On an inner wall of the second stator 42, a plurality of second permanent magnets 42a are installed at a predetermined interval.

At the second armature coil unit 41a installed inside the second stator 42, a plurality of armature coils are installed. When an electric signal is fed to the plurality of armature coils, thrust force is generated between the second armature coil unit 41a and the plurality of second permanent magnets 42a for thereby moving the second mover 41 in the Y-axis direction and controlling the Y-axis position of the feeder stage 16.

One end of a first connection panel 11a is installed at one side of the second stator 42, and the other end thereof is fixedly installed at the base frame 11. One end of a second connection panel 11b is installed at the other side of the second stator 42, and the other end thereof is fixedly installed at the base frame 11. Resultantly, the second stator 42 is fixedly installed at the base frame 11.

As seen from above, the mounting position of the tape reel can be controlled easily by controlling the position of the feeder stage at which the tape reel is mounted in the surface mount device.

As described above, the present invention provides an effect of easily controlling the mounting position of the tape reel by controlling the position of the feeder stage at which the tape reel is mounted in the surface mount device.

What is claimed is:

1. A position control apparatus of a feeder stage disposed inside a base frame of a surface mount device comprising:
    a height/rotation power transmission device installed on the feeder stage for adjusting a height and a rotation angle of the feeder stage;
    a first power transmission device coupled to the height/rotation power transmission device that variably controls a position of the feeder stage in the X-axis direction; and
    a second power transmission device coupled to the first power transmission device that variably controls a position of the feeder stage in the Y-axis direction.

2. The position control apparatus of claim 1, wherein the height/rotation power transmission device comprises a linear gear, wherein one end of the linear gear is coupled to the feeder stage, and a cylindrical stator.

3. The position apparatus of claim 2, wherein the first power transmission device comprises:
    a first mover installed at the bottom of the height/rotation power transmission device, and having a first armature coil unit installed thereon; and
    a first stator in which the first armature coil unit is installed at its inside and wherein a plurality of first permanent magnets are installed on an inner wall of the first stator at predetermined intervals.

4. The position apparatus of claim 1, wherein the height/rotation power transmission device comprises a rotary/linear motor formed integrally, so that the feeder stage is moved in linear and rotary motions relative to one or more axes simultaneously.

5. The position apparatus of claim 4, wherein the second power transmission device comprises:
    a second mover coupled to the first power transmission device, and having a second armature coil installed thereon; and
    a second stator in which the second armature coil unit is installed to its inside and wherein a plurality of second permanent magnets are installed on an inner wall of the second stator at a predetermined interval.

6. The position apparatus of claim 1, wherein the second power transmission device comprises:
    a second mover coupled to the first power transmission device, and having a second armature coil installed thereon; and
    a second stator in which the second armature coil unit is installed to its inside and wherein a plurality of second permanent magnets are installed on an inner wall of the second stator at a predetermined interval.

7. The position apparatus of claim 6, further comprising:
    a first connection panel having a first end attached to a first side of the second stator and a second end attached to the base frame; and
    a second connection panel having a first end attached to a second side of the second stator and a second end attached to the base frame.

8. The position apparatus of claim 1, wherein the first power transmission device comprises:
    a first mover installed at the bottom of the height/rotation power transmission device, and having a first armature coil unit thereon; and
    a first stator in which the first armature coil unit is installed at its inside and wherein a plurality of first permanent magnets are installed on an inner wall of the first stator at predetermined intervals.

* * * * *